United States Patent
Piner et al.

(10) Patent No.: US 7,687,827 B2
(45) Date of Patent: Mar. 30, 2010

(54) III-NITRIDE MATERIALS INCLUDING LOW DISLOCATION DENSITIES AND METHODS ASSOCIATED WITH THE SAME

(75) Inventors: Edwin L. Piner, Cary, NC (US); John C. Roberts, Hillsborough, NC (US); Pradeep Rajagopal, Raleigh, NC (US)

(73) Assignee: Nitronex Corporation, Durham, NC (US)

( * ) Notice: Subject to any disclaimer, the term of this patent is extended or adjusted under 35 U.S.C. 154(b) by 478 days.

(21) Appl. No.: 10/886,506

(22) Filed: Jul. 7, 2004

(65) Prior Publication Data

US 2006/0006500 A1    Jan. 12, 2006

(51) Int. Cl.
*H01L 31/101* (2006.01)
(52) U.S. Cl. ............... 257/189; 257/615; 257/E31.019; 257/E27.012
(58) Field of Classification Search ................. 257/189, 257/200, 615, 745, E31.019, E27.012
See application file for complete search history.

(56) References Cited

U.S. PATENT DOCUMENTS

| | | | |
|---|---|---|---|
| 4,768,038 A | 8/1988 | Shibata | |
| 5,192,987 A | 3/1993 | Khan et al. | |
| 5,239,188 A | 8/1993 | Takeuchi et al. | |
| 5,290,393 A | 3/1994 | Nakamura | |
| 5,296,395 A | 3/1994 | Khan et al. | |
| 5,389,571 A | 2/1995 | Takeuchi et al. | |
| 5,393,993 A | 2/1995 | Edmond et al. | |
| 5,523,589 A | 6/1996 | Edmond et al. | |
| 5,633,192 A | 5/1997 | Moustakas et al. | |
| 5,679,965 A | 10/1997 | Schetzina | |

(Continued)

FOREIGN PATENT DOCUMENTS

EP    1209729 A1    5/2002

(Continued)

OTHER PUBLICATIONS

T. Hino et al., "Characterization of threading dislocations in GaN epitaxial layers", Jun. 5, 2000, Applied Physics Letters, vol. 76, No. 23, pp. 3421-3423.*

(Continued)

*Primary Examiner*—Lynne A. Gurley
*Assistant Examiner*—Colleen A Matthews
(74) *Attorney, Agent, or Firm*—Wolf, Greenfield & Sacks, P.C.

(57) ABSTRACT

Semiconductor structures including one, or more, III-nitride material regions (e.g., gallium nitride material region) and methods associated with such structures are provided. The III-nitride material region(s) advantageously have a low dislocation density and, in particular, a low screw dislocation density. In some embodiments, the presence of screw dislocations in the III-nitride material region(s) may be essentially eliminated. The presence of a strain-absorbing layer underlying the III-nitride material region(s) and/or processing conditions can contribute to achieving the low screw dislocation densities. In some embodiments, the III-nitride material region(s) having low dislocation densities include a gallium nitride material region which functions as the active region of the device. The low screw dislocation densities of the active device region (e.g., gallium nitride material region) can lead to improved properties (e.g., electrical and optical) by increasing electron transport, limiting non-radiative recombination, and increasing compositional/growth uniformity, amongst other effects.

37 Claims, 8 Drawing Sheets

U.S. PATENT DOCUMENTS

| | | | |
|---|---|---|---|
| 5,690,736 | A | 11/1997 | Tokunaga |
| 5,739,554 | A | 4/1998 | Edmond et al. |
| 5,741,724 | A | 4/1998 | Ramandi et al. |
| 5,760,426 | A | 6/1998 | Marx et al. |
| 5,786,606 | A | 7/1998 | Nishio et al. |
| 5,815,520 | A | 9/1998 | Furushima |
| 5,838,029 | A | 11/1998 | Shakuda |
| 5,838,706 | A | 11/1998 | Edmond et al. |
| 5,874,747 | A | 2/1999 | Redwing et al. |
| 5,880,485 | A | 3/1999 | Marx et al. |
| 5,929,467 | A | 7/1999 | Kawai et al. |
| 5,973,335 | A | 10/1999 | Shannon |
| 6,051,849 | A | 4/2000 | Davis et al. |
| 6,064,078 | A | 5/2000 | Northrup et al. |
| 6,064,082 | A | 5/2000 | Kawai et al. |
| 6,069,021 | A | 5/2000 | Terashima et al. |
| 6,100,545 | A | 8/2000 | Chiyo et al. |
| 6,120,600 | A | 9/2000 | Edmond et al. |
| 6,121,121 | A | 9/2000 | Koide |
| 6,139,628 | A | 10/2000 | Yuri et al. |
| 6,146,457 | A | 11/2000 | Solomon |
| 6,153,010 | A | 11/2000 | Kiyoku et al. |
| 6,156,581 | A | 12/2000 | Vaudo et al. |
| 6,177,688 | B1 | 1/2001 | Linthicum et al. |
| 6,180,270 | B1 | 1/2001 | Cole et al. |
| 6,201,262 | B1 | 3/2001 | Edmond et al. |
| 6,255,198 | B1 | 7/2001 | Linthicum et al. |
| 6,261,929 | B1 | 7/2001 | Gehrke et al. |
| 6,261,931 | B1 | 7/2001 | Keller et al. |
| 6,265,289 | B1 | 7/2001 | Zheleva et al. |
| 6,291,319 | B1 | 9/2001 | Yu et al. |
| 6,328,796 | B1 | 12/2001 | Kub et al. |
| 6,329,063 | B2 | 12/2001 | Lo et al. |
| 6,358,770 | B2 | 3/2002 | Itoh et al. |
| 6,380,108 | B1 | 4/2002 | Linthicum et al. |
| 6,391,748 | B1 | 5/2002 | Temkin et al. |
| 6,403,451 | B1 | 6/2002 | Linthicum et al. |
| 6,420,197 | B1 | 7/2002 | Ishida et al. |
| 6,426,512 | B1 | 7/2002 | Ito et al. |
| 6,440,823 | B1 | 8/2002 | Vaudo et al. |
| 6,441,393 | B2 | 8/2002 | Goetz et al. |
| 6,459,712 | B2 | 10/2002 | Tanaka et al. |
| 6,461,944 | B2 | 10/2002 | Neudeck et al. |
| 6,465,814 | B2 | 10/2002 | Kasahara et al. |
| 6,486,502 | B1 | 11/2002 | Sheppard et al. |
| 6,497,763 | B2 | 12/2002 | Kub et al. |
| 6,498,111 | B1 | 12/2002 | Kapolnek et al. |
| 6,521,514 | B1 | 2/2003 | Gehrke et al. |
| 6,524,932 | B1 * | 2/2003 | Zhang et al. ................ 438/459 |
| 6,548,333 | B2 | 4/2003 | Smith |
| 6,583,034 | B2 | 6/2003 | Ramdani et al. |
| 6,583,454 | B2 | 6/2003 | Sheppard et al. |
| 6,586,781 | B2 | 7/2003 | Wu et al. |
| 6,610,144 | B2 | 8/2003 | Mishra et al. |
| 6,611,002 | B2 | 8/2003 | Weeks et al. |
| 6,617,060 | B2 * | 9/2003 | Weeks et al. ................ 428/698 |
| 6,624,452 | B2 | 9/2003 | Yu et al. |
| 6,649,287 | B2 | 11/2003 | Weeks, Jr. et al. |
| 6,656,615 | B2 | 12/2003 | Dwilinski et al. |
| 6,657,232 | B2 | 12/2003 | Morkoc |
| 6,759,715 | B2 * | 7/2004 | Shibata et al. ............... 257/352 |
| 6,765,240 | B2 | 7/2004 | Tischler et al. |
| 6,765,241 | B2 | 7/2004 | Ohno et al. |
| 6,777,278 | B2 | 8/2004 | Smith |
| 6,841,409 | B2 | 1/2005 | Onishi |
| 6,849,882 | B2 | 2/2005 | Chavarkar et al. |
| 2001/0042503 | A1 | 11/2001 | Lo et al. |
| 2002/0020341 | A1 | 2/2002 | Marchand et al. |
| 2002/0074552 | A1 * | 6/2002 | Weeks et al. ................ 257/76 |
| 2002/0117695 | A1 | 8/2002 | Borges |
| 2002/0167019 | A1 | 11/2002 | Nakamura et al. |
| 2003/0136333 | A1 | 7/2003 | Semond et al. |
| 2004/0021147 | A1 | 2/2004 | Ishibashi et al. |
| 2004/0130002 | A1 | 7/2004 | Weeks et al. |
| 2004/0137685 | A1 | 7/2004 | Lochtefeld et al. |
| 2004/0262630 | A1 | 12/2004 | Kitaoka et al. |
| 2005/0006639 | A1 * | 1/2005 | Dupuis et al. ................ 257/20 |
| 2005/0247942 | A1 | 11/2005 | Hon et al. |
| 2005/0285141 | A1 | 12/2005 | Piner et al. |
| 2005/0285142 | A1 | 12/2005 | Piner et al. |

FOREIGN PATENT DOCUMENTS

| | | |
|---|---|---|
| EP | 1439572 | 7/2004 |
| JP | 09134878 | 5/1997 |
| WO | WO 96/41906 | 12/1996 |
| WO | WO 01/13436 | 2/2001 |

OTHER PUBLICATIONS

Amano, H. et al., "Improvement of Crystalline Quality of Group III Nitrides on Sapphire Using Low Temperature Interlayers," MRS Internet J. Nitride Semicond. Res. 4S1, G10.1 (1999).

Beaumont, B. et al., "Lateral Overgrowth of GaN on Patterned GaN/Sapphire Substrate Via Selective Metal Organic Vapour Phase Epitaxy: A Route to Produce Self Supported GaN Substrates," J. Crystal Growth 189/190:97 (1998).

Brown, J.D. et al., "AlGaN/GaN HFETs Fabricated on 100-mm GaN on Silicon (111) Substrates," Solid-State Electronics 46:1535 (2002).

Brown, J.D. et al., "Performance of AlGaN/GaN HFETs Fabricated on 100mm Silicon Substrates for Wireless Basestation Applications," Nitronex Corporation, IEEE MTT-S Digest p. 833 (2004).

Bykhovski, A.D. et al., "Elastic Strain Relaxation in GaN-AlN-GaN Semiconductor-Insulator-Semiconductor Structures," J.Appl. Phys. 78(6):3691 (1995).

Chen, P. et al., "Growth of High Quality GaN Layers With AlN Buffer on Si(111) Substrates," J. Crystal Growth 225:150 (2001).

Dadgar, A. et al., "Bright, Crack-Free InGaN/GaN Light Emitters on Si(111)," Phys. Stat. Sol. 192(2):308 (2002).

Dadgar, A. et al., "Metalorganic Chemical Vapor Phase Epitaxy of Crack-Free GaN on Si (111) Exceeding 1 μm in Thickness," Jpn. J. Appl. Phys. 39:L1183 (2000).

Dadgar, A. et al., "MOVPE Growth of GaN on Si(111) Substrates," J. Crystal Growth 248:556 (2003).

Davis, R. et al., "Conventional and Pendeo-Epitaxial Growth of GaN(0001) Thin Films on Si(111) Substrates," J. Crystal.Growth 231:335(2001).

Elhamri, S. et al., "An Electrical Characterization of a Two Dimensional Electron Gas in GaN/AlGaN on Silicon Substrates," J. Appl. Phys. 95(12):7982 (2004).

Guha, S. et al., "Ultraviolet and Violet GaN Light Emitting Diodes on Silicon," Appl. Phys. Lett. 72(4):415 (1998).

Haffouz, S. et al., "The Effect of the Si/N Treatment of a Nitridated Sapphire Surface on the Growth Mode of GaN in Low-Pressure Metalorganic Vapor Phase Epitaxy," Appl. Phys. Lett. 73(9):1278 (1998).

Hageman, P.R. et al., "High Quality GaN Layers on Si(111) Substrates: AlN Buffer Layer Optimisation and Insertion of a SiN Intermediate Layer," Phys. Stat. Sol. 188(2):523 (2001).

Hanson, A.W. et al., "Development of a GaN Transistor Process for Linear Power Applications," Nitronex Corporation, Paper presented at the 2004 International Conference on Compound Semiconductor Manufacturing Technology (GaAs MANTECH), Miami, FL.

Hirosawa, K. et al., "Growth of Single Crystal $Al_2Ga_{1-\alpha}N$ Films on Si Substrates by Metalorganic Vapor Phase Epitaxy," Jpn. J. Appl. Phys. 32:L1039 (1993).

Ishikawa, H. et al., "High-Quality GaN on Si Substrate Using AlGaN/AlN Intermediate Layer," Phys. Stat. Sol. 176:599 (1999).

Johnson, J.W. et al., "12 W/mm AlGaN-GaN HFETs on Silicon Substrates," IEEE Electron Device Lett. 25(7):459 (2004).

Johnson, J.W. et al., "Material, Process, and Device Development of GaN-Based HFETs on Silicon Substrates," Nitronex Corporation, Electrochemical Society Proceedings Jun. 2004, 405 (2004).

Kang, B.S. et al., "Pressure-Induced Changes in the Conductivity of AlGaN/GaN High-Electron Mobility-Transistor Membranes," Appl. Phys. Lett. 85(14):2962 (2004).

Lahreche, H. et al., "Growth of High-Quality GaN by Low-Pressure Metal-Organic Vapour Phase Epitaxy (LP-MOVPE) From 3D Islands and Lateral Overgrowth," J. Crystal Growth 205:245 (1999).

Lahreche, H. et al., "Optimisation of AlN and GaN Growth by Metalorganic Vapour-Phase Epitaxy (MOVPE) on Si(111)," J. Crystal Growth 217:13 (2000).

Lee, I. et al., "Growth and Optical Properties of GaN on Si(111) Substrates," J. Crystal Growth 235:73 (2002).

Lei, T. et al., "Epitaxial Growth of Zinc Blende and Wurtzitic Gallium Nitride Thin Films on (001) Silicon," Appl. Phys. Lett. 59(8):944 (1991).

Liu, R. et al., "Atomic Arrangement at the AlN/Si (111) Interface," Appl. Phys. Lett. 83(5):860 (2003).

Nagy, W. et al., "Linearity Characteristics of Microwave Power GaN HEMTs," IEEE Transactions on Microwave Theory & Techniques 51(2):1 (2003).

Nakada, Y. et al., "GaN Heteroepitaxial Growth on Silicon Nitride Buffer Layers Formed on Si (111) Surfaces by Plasma-Assisted Molecular Beam Epitaxy," Appl. Phys. Lett. 73(6):827 (1998).

Nikishin, S.A. et al., "High Quality GaN Grown on Si(111) by Gas Source Molecular Beam Epitaxy with Ammonia," Appl. Phys. Lett. 75(14):2073 (1999).

Nuttinck, S. et al., "Direct On-Wafer Non-Invasive Thermal Monitoring of AlGaN/GaN Power HFETs Under Microwave Large Signal Conditions," Paper Presented at European Microwave Week, Amsterdam, NL (2004).

Ohtani, A. et al., "Microstructure and Photoluminescence of GaN Grown on Si(111) by Plasma-Assisted Molecular Beam Epitaxy," Appl. Phys. Lett. 65(1):61 (1994).

Okamoto, Y. et al., "An 80W AlGaN/GaN Heterojunction FET With a Field-Modulating Plate," IEEE MTT-S Digest p. 225 (2003).

Osinsky, A. et al., "Visible-Blind GaN Schottky Barrier Detectors Grown on Si(111)," Appl. Phys. Lett. 72(5):551 (1998).

Piner, E., "GaN Transistors and Power Amplifiers Close in on Commercialization," Compound Semiconductor (Jul. 2004).

Rajagopal, P. et al., "Large-Area, Device Quality GaN on Si Using a Novel Transition Layer Scheme," Nitronex Corporation, Material Research Society Symposium Proceedings 743(3) (2003).

Rajagopal, P. et al., "MOCVD AlGaN/GaN HFETs on Si: Challenges and Issues," Symposium Y: GAN and Related Alloys, Nitronex Corporation, Material Research Society Symposium Proceedings, 798, 61-66 (2004).

Reitmeier, Z. et al., "Growth and Characterization of AlN and GaN Thin Films Deposited on Si(111) Substrates Containing a Very Thin Al Layer," Dept. Materials Science & Engineering, NC State University.

Semond, F. et al., "GaN Grown on Si(111) Substrate: From Two-Dimensional Growth to Quantum Well Assessment," Appl. Phys. Lett. 75(1):82 (1999).

Seon, M. et al., "Selective Growth of High Quality GaN on Si(111) Substrates," Appl. Phys. Lett. 76(14):1842 (2000).

Singhal, S. et al., "Gallium Nitride on Silicon HEMTs for Wireless Infrastructure Applications, Thermal Design and Performance," Nitronex Corporation, Paper presented at the European Microwave Week, Milan, Italy (2002).

Tanaka, S. et al., "Anti-Surfactant in III-Nitride Epitaxy-Quantum Dot Formation and Dislocation Termination-," Jpn. J. Appl. Phys. 39:L831 (2000).

Tanaka, S. et al., "Defect Structure in Selective Area Growth GaN Pyramid on (111)Si Substrate," Appl. Phys. Lett. 76(19):2701 (2000).

Thompson, R. et al., "Improved Fabrication Process for Obtaining High Power Density AlGaN/GaN HEMTs," IEEE GaAs Digest p. 298 (2003).

Tolle, J. et al., "Epitaxial Growth of $Al_xGa_{1-x}N$ on Si(111) via a $ZrB_2$ (0001) Buffer Layer," App. Phys. Lett. 84(18):3510 (2004).

Tolle, J. et al., "Epitaxial Growth of Group III Nitrides on Silicon Substrates Via a Reflective Lattice-Matched Zirconium Diboride Buffer Layer," App. Phys. Lett. 82(15):2398 (2003).

Vennegues, P. et al., "Influence of in Situ Sapphire Surface Preparation and Carrier Gas on the Growth Mode of GaN in MOVPE," J. Crystal Growth 187:167 (1998).

Vescan, A. et5 al., "AlGaN/GaN HFETs on 100 mm Silicon Substrates for Commercial Wireless Applications," Phys. Stat. Sol. (c) 0(1):52 (2002).

Zhao, Z.M. et al., "Metal-Semiconductor-Metal GaN Ultraviolet Photodetectors on Si(111)," Appl. Phys. Lett. 77(3):444 (2000).

Office Action from U.S. Appl. No. 11/096,505, mailed Apr. 24, 2007.

Response to Office Action mailed Dec. 14, 2006 from U.S. Appl. No. 10/879,703.

Office Action from U.S. Appl. No. 10/879,703, mailed Feb. 6, 2007.

Office Action from U.S. Appl. No. 10/879,703, mailed Jun. 14, 2006.

* cited by examiner

III-NITRIDE MATERIALS INCLUDING LOW DISLOCATION DENSITIES AND METHODS ASSOCIATED WITH THE SAME

FIELD OF INVENTION

The invention relates generally to III-nitride materials and, more particularly, to III-nitride (e.g., gallium nitride) material structures including low dislocation densities, as well as methods associated with the same.

BACKGROUND OF INVENTION

III-nitride materials include gallium nitride (GaN), aluminum nitride (AlN), indium nitride (InN) and their respective alloys (e.g., AlGaN, InGaN, AlInGaN and AlInN). In particular, gallium nitride materials (GaN and its alloys) have attractive properties including the ability to efficiently emit blue light, the ability to transmit signals at high frequency, and others. Accordingly, gallium nitride materials are being widely investigated in many microelectronic applications such as transistors, field emitters, and optoelectronic devices. Semiconductor structures that include gallium nitride material regions oftentimes include regions of other III-nitride materials (e.g., AlN). Such layers, for example, may function as buffer or intermediate layers positioned between a substrate and an overlying gallium nitride material region.

III-nitride materials have different crystal structures and properties than many common substrates including silicon, silicon carbide and sapphire. Thus, when III-nitride materials are formed on such substrates, these differences may lead to the formation of defects including dislocations. For example, dislocations may result from differences between the lattice constants of the substrate and the III-nitride material; differences between the thermal expansion coefficients of the substrate and the III-nitride material; as well as, substrate quality including misorientation and defects.

Dislocations are linear imperfections in a crystalline array of atoms. Types of dislocations include edge dislocations, screw dislocations and mixed dislocations (which have an edge component and a screw component). The presence of dislocations in III-nitride materials that are in the vicinity of the active region in a device can impair device performance. For example, the dislocations can function as scattering centers which effect electron transport and, thus, impair electrical performance. Also, the dislocations can function as non-radiative recombination centers which reduce performance of opto-electronic devices. Furthermore, dislocations can lead to inhomogeneities in composition and formation of macrodefects which can also negatively effect device performance.

Certain conventional vertical growth processes (i.e., growth that proceeds in a vertical direction from the underlying layer) form III-nitride material regions having screw dislocation densities of greater than about $10^{12}/cm^3$. Lateral growth processes can produce localized areas within III-nitride material regions having low defect densities, while other areas within the regions have relatively high defect densities. Lateral growth processes are typically more complex than vertical growth processes.

SUMMARY OF INVENTION

The invention provides III-nitride materials having low dislocation (e.g., screw dislocation) densities including structures, devices and methods associated with the materials.

In one embodiment, a semiconductor structure is provided. The structure comprises a III-nitride material region having a screw dislocation density of less than about $10^8/cm^2$ throughout the III-nitride material region.

In another embodiment, a semiconductor structure is provided. The structure comprises a III-nitride material region including an area having dimensions of at least about 100 microns×100 microns and a screw dislocation density of less than about $10^4/cm^2$.

In another embodiment, a semiconductor structure is provided. The structure comprises a semiconductor region having a top surface; and, a III-nitride material region formed over the top surface and having a different composition than the semiconductor region. A cross-sectional area of the III-nitride material region within 100 nanometers of the top surface has a screw dislocation density of less than about $10^8/cm^2$.

In another embodiment, a semiconductor structure is provided. The structure comprises a III-nitride material region having a screw dislocation density of less than about $10^8/cm^2$ and an edge dislocation density of greater than about $10^8/cm^2$.

In another embodiment, a semiconductor structure is provided. The structure comprises a III-nitride material region having an edge dislocation density and a screw dislocation density. The edge dislocation density is at least 100 times greater than the screw dislocation density.

In another embodiment, a semiconductor structure is provided. The structure comprises a substrate, and a silicon nitride-based material layer having a thickness of less than 100 Angstroms and substantially covering an entire top surface of the substrate. The structure further comprises a III-nitride material region formed over the silicon nitride-based material layer and having a screw dislocation density of less than about $10^8/cm^2$.

In another embodiment, a method of forming a semiconductor structure is provided. The method comprises providing a substrate; and, forming a gallium nitride material region over the substrate having a screw dislocation density of less than about $10^8/cm^2$ throughout the III-nitride material region.

In another embodiment, a method of forming a semiconductor structure is provided. The method comprises providing a semiconductor material region having a top surface; and, vertically growing a III-nitride material region over the semiconductor material region. The III-nitride material region has a composition different than the semiconductor material region. A screw dislocation density in a cross-sectional area of the III-nitride material region located within 100 nanometers of the top surface of the semiconductor material region is less than about $10^8/cm^2$.

Other aspects, embodiments and features of the invention will become apparent from the following detailed description of the invention when considered in conjunction with the accompanying drawings. The accompanying figures are schematic and are not intended to be drawn to scale. In the figures, each identical, or substantially similar component that is illustrated in various figures is represented by a single numeral or notation. For purposes of clarity, not every component is labeled in every figure. Nor is every component of each embodiment of the invention shown where illustration is not necessary to allow those of ordinary skill in the art to understand the invention. All patent applications and patents incorporated herein by reference are incorporated by reference in their entirety. In case of conflict, the present specification, including definitions, will control.

DETAILED DESCRIPTION

The invention provides semiconductor structures including one or more III-nitride material region(s) (e.g., a gallium nitride material region) and methods associated with such structures. The III-nitride material region(s) advantageously have a low dislocation density and, in particular, a low screw dislocation density. In some embodiments, the presence of screw dislocations in the III-nitride material region(s) may be essentially eliminated. As described further below, the presence of a strain-absorbing layer underlying the III-nitride material region(s), amongst other factors, can contribute to achieving the low screw dislocation densities. In some embodiments, the III-nitride material region(s) having low dislocation densities include a gallium nitride material region which functions as the active region of the device. The low screw dislocation densities of the active device region (e.g., gallium nitride material region) can lead to improved properties (e.g., electrical and optical) by decreasing electron scattering, limiting non-radiative recombination, increasing compositional uniformity, and reducing macro-defect formation, amongst other effects.

Figure 1:
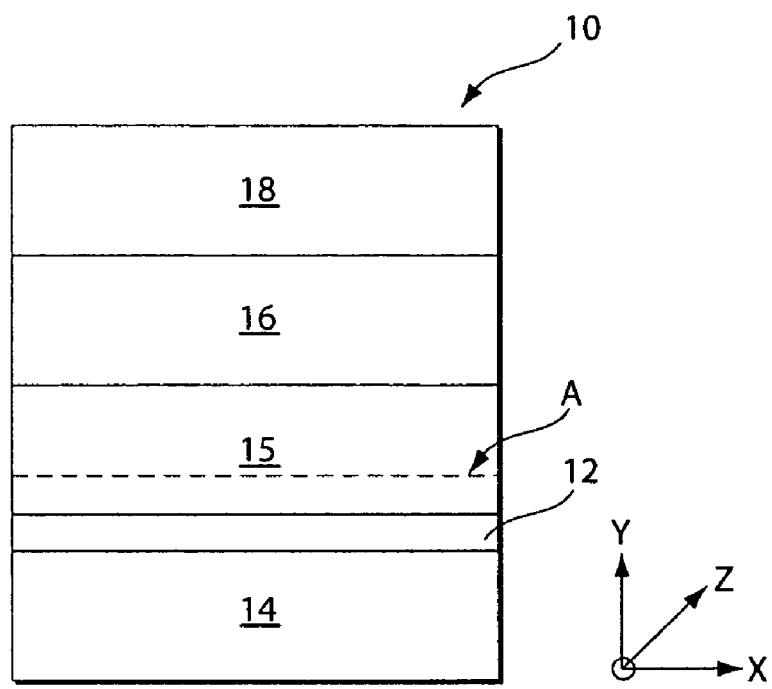
FIG. 1 illustrates a structure including III-nitride material regions having low screw dislocation densities according to one embodiment of the present invention.

FIG. 1 illustrates a semiconductor structure 10 according to one embodiment of the invention. The semiconductor structure includes a strain-absorbing layer 12 formed on a substrate 14. A series of III-nitride material regions are formed on the strain-absorbing layer. In this illustrative embodiment, the series of III-nitride material regions includes an intermediate layer 15, a transition layer 16 and a gallium nitride material region 18. As described further below, the strain-absorbing layer (amongst other factors) may help contribute to limiting generation of screw dislocation densities in at least one (and, in some cases, all) of the overlying III-nitride layers and, in particular, in the gallium nitride material region. Semiconductor structures of the invention may form the basis of a number of semiconductor devices including transistors (e.g., FET), Schottky diodes, light emitting diodes and laser diodes, amongst others.

When a layer is referred to as being "on" or "over" another layer or substrate, it can be directly on the layer or substrate, or an intervening layer also may be present. A layer that is "directly on" another layer or substrate means that no intervening layer is present. It should also be understood that when a layer is referred to as being "on" or "over" another layer or substrate, it may cover the entire layer or substrate, or a portion of the layer or substrate.

As used herein, the term "III-nitride material" refers to any Group III element-nitride compound including boron nitride (BN), aluminum nitride (AlN), gallium nitride (GaN), indium nitride (InN) and thalium nitride (TlN), as well as any alloys including Group III elements and Group V elements (e.g., $Al_xGa_{(1-x)}N$, $Al_xIn_yGa_{(1-x-y)}N$, $In_yGa_{(1-y)}N$ $Al_yIn_{(1-y)}N$, $GaAs_aP_bN_{(1-a-b)}$, $Al_xIn_yGa_{(1-x-y)}As_aP_bN_{(1-a-b)}$ and the like). Typically, when present, arsenic and/or phosphorous are at low concentrations (i.e., less than 5 weight percent). III-nitride materials may be doped n-type or p-type, or may be intrinsic.

As used herein, the phrase "gallium nitride material" refers to gallium nitride (GaN) and any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$) gallium arsenide phosporide nitride ($GaAs_aP_bN_{(1-a-b)}$), aluminum indium gallium arsenide phosporide nitride ($Al_xIn_yGa_{(1-x-y)}As_aP_bN_{(1-a-b)}$), amongst others. Typically, when present, arsenic and/or phosphorous are at low concentrations (i.e., less than 5 weight percent). In certain preferred embodiments, the gallium nitride material has a high concentration of gallium and includes little or no amounts of aluminum and/or indium. In high gallium concentration embodiments, the sum of (x+y) may be less than 0.4, less than 0.2, less than 0.1, or even less. In some cases, it is preferable for the gallium nitride material layer to have a composition of GaN (i.e., x+y=0). Gallium nitride materials may be doped n-type or p-type, or may be intrinsic. Suitable gallium nitride materials have been described in commonly-owned U.S. Pat. No. 6,649,287 which is incorporated herein by reference.

As used herein, the term "region" may refer to one layer (e.g., layer 15, layer 16) or may refer to a series of layers (e.g., gallium nitride material region 18 including layers 18a, 18b, 18c).

At least one of the III-nitride material regions (e.g., intermediate layer 15, transition layer 16, gallium nitride material region 18) formed on the strain-absorbing layer has low screw dislocation densities. In some embodiments, it may be preferred for all of the III-nitride material regions formed on the strain-absorbing layer to have low screw dislocation densities (including the screw dislocation density values noted below). It may be particularly preferable for the gallium nitride material region to have a low screw dislocation density because in many device applications the active device region is formed in the gallium nitride material region, as described further below.

However, it should be understood, that in certain embodiments, it may be possible for one or more of these III-nitride material regions to have higher screw dislocation densities.

In some embodiments, the screw dislocation density in one (or more) of the III-nitride material regions above the strain-absorbing layer is less than about $10^8$ screw dislocations/cm², and, in some cases, less than about $10^6$/cm². It is even possible to achieve significantly lower screw dislocation densities within the scope of the present invention. In some embodiments, one (or more) of the III-nitride material regions have very low screw dislocation densities of less than about $10^4$/cm² and, in some cases, less than about $10^2$/cm². In some embodiments, it is even possible for one (or more) of the III-nitride material regions to have substantially zero screw dislocations.

As used herein, units for screw dislocation density may be expressed as "screw dislocations/cm$^2$" or "/cm$^2$".

In some preferred embodiments, at least the gallium nitride material region has the low screw dislocation density values noted above.

The specific screw dislocation density depends, in part, on the particular structure including factors such as the thickness, composition and crystal structure of the strain-absorbing layer; the composition, thickness and crystal structure of the overlying III-nitride material layer(s)/region(s); as well as, the composition, thickness, and crystal structure of the substrate, amongst other factors.

Screw dislocation densities may be measured using known techniques. For example, a diffraction contrast technique (e.g., g-vector analysis), which involves comparing transmission electron microscope (TEM) images of the material structure obtained under different imaging conditions, may be used to selectively view the screw dislocations and measure the screw dislocation density.

It should be understood that the screw dislocation densities described herein are measured over a representative area. The representative area may depend, in part, on the actual dislocation density being measured. For example, a representative area of about 100 microns squared (e.g., 10 micron×10 micron) may be suitable for measuring screw dislocation densities on the order of 10$^8$/cm$^2$. Larger representative areas may be used for smaller screw dislocation densities.

Advantageously, in some embodiments, the above-identified screw dislocation density ranges are present throughout one (or more) of the respective III-nitride material region(s) overlying the stress-absorbing layer. That is, throughout the entire volume of at least one (or more) of the III-nitride material region(s), the screw dislocation densities ranges identified above may be achieved.

It should be understood that, in some embodiments, all of the III-nitride material regions (e.g., intermediate layer 15, a transition layer 16 and a gallium nitride material region 18) formed over the strain-absorbing layer have the above-identified screw dislocation densities.

The low screw dislocation densities are also achievable across large areas of III-nitride material regions. For example, the above-identified screw dislocation densities may be found in regions having an area of greater than about 10$^4$ square microns; or, greater than about 1 mm$^2$. In some cases, the areas of the III-nitride material regions having the low screw dislocation densities may be greater than about 1 cm$^2$, or more.

The above-noted areas may comprises a variety of dimensions (i.e., lengths, widths) including similar lengths and widths. For example, the above-identified screw dislocation densities may be found in areas having dimensions of greater than about 100 microns×100 microns; or, greater than about 1 mm×1 mm. In some cases, the areas of the III-nitride material regions having the low screw dislocation densities may have dimensions of greater than about 1 cm×1 cm, or more.

The consistently low screw dislocation densities across large areas and/or throughout the entire region(s) provides advantages over certain prior art techniques (e.g., certain lateral growth processes) that form, within a respective III-nitride material region, areas of low screw dislocation density and also areas of high screw dislocation density (e.g., greater than 10$^8$/cm$^2$).

In some embodiments, the III-nitride material region may have a substantially constant screw dislocation density throughout the entire region and/or area. In some embodiments, the screw dislocation density is substantially constant along an axial direction (i.e., z-axis in FIG. 1) and is also substantially constant along a radial direction (i.e., x-axis in FIG. 1).

The above-identified screw dislocation densities are achievable within areas of the III-nitride material region proximate to (e.g., within 100 nanometers, or within 50 nanometers) an underlying semiconductor region (e.g., substrate or semiconductor layer) formed of a different material composition. The area, for example, is a cross-sectional area (e.g., A, in FIG. 1) of the III-nitride material region within 100 nanometers (or, within 50 nanometers) of the upper surface of the underlying region. The cross-sectional area may extend across the III-nitride region and may be parallel to the lower surface of the III-nitride material region (or the upper surface of the underlying region). The cross-sectional area may have any of the area values described above. The cross-sectional area and the III-nitride material region may be directly above the underlying semiconductor region, as shown.

In these embodiments, strain-absorbing layer 15 (with a thickness of less than 100 nanometers) may be formed between the III-nitride material region and the underlying semiconductor region (e.g., substrate 14).

In some cases, above-identified screw dislocation densities are achievable within an area of the III-nitride material region formed within 100 nanometers (or, 50 nanometers) of the top surface of a substrate having a different material composition than the III-nitride material region. In these cases, the substrate may be formed of silicon, silicon carbide, sapphire (or, other substrate materials described below that meet this condition). The III-nitride material region may be intermediate layer 15, transition layer 16 or gallium nitride material region 18, depending on the structure.

In some cases, above-identified screw dislocation densities are achievable in a III-nitride material region formed within 100 nanometers (or, 50 nanometers) of the top surface of a semiconductor layer (i.e., non-substrate) having a different material composition than the III-nitride material region. For example, the semiconductor material layer may be formed of a III-nitride material having a different composition than the III-nitride material region.

The mechanism for limiting/eliminating screw dislocations in structures of the present invention may not have as significant an effect on lowering the edge dislocation density or mixed dislocation density. For example, in some embodiments, the edge dislocation density and/or mixed dislocation density may be greater than about 10$^8$/cm$^2$ in the III-nitride material region having the reduced screw dislocation density. In some cases, the edge dislocation density and/or mixed dislocation density is at least 100 times, or at least 10$^4$ times, greater than the screw dislocation density in the III-nitride material region. In embodiments having very low screw dislocation densities, the edge dislocation density and/or mixed dislocation density may be at least 10$^6$, or at least 10$^8$ times, the screw dislocation density in the III-nitride material region. In embodiments that do not have low edge and/or mixed dislocation densities, it should be understood that the structures still have the above-identified advantages associated with lower screw dislocation densities.

It should be understood, however, that in some embodiments of the invention lower edge and mixed dislocation densities than those described above may be achieved. It also should be understood that the above-referenced edge dislocation densities may be present throughout the III-nitride material region(s) and, at least, in the same portions of the III-nitride material region(s) having reduced screw dislocation densities.

It is believed that the low screw dislocation densities are achieved, at least in part, by the presence of the strain-absorbing layer. However, it should be understood that in certain embodiments of the invention that do not include the strain-absorbing layer, the III-nitride material regions may also have the low screw dislocation densities. Other factors include the composition, thickness and crystal structure of the intermediate layer, transition layer and III-nitride material region; the composition, thickness, and crystal structure of the substrate; and, process conditions described further below, amongst other factors.

In particular, the composition, thickness and crystal structure of the strain-absorbing layer may contribute to reducing the formation of screw dislocations in the overlying III-nitride material layer(s)/region. The strain-absorbing layer may also reduce the formation of misfit dislocations in the layer formed on in the gallium nitride material region as described in commonly-owned, co-pending U.S. patent application Ser. No. not yet assigned, filed Jun. 28, 2004, entitled "Gallium Nitride Materials and Methods Associated with the Same" which is incorporated herein by reference.

Figure 2:
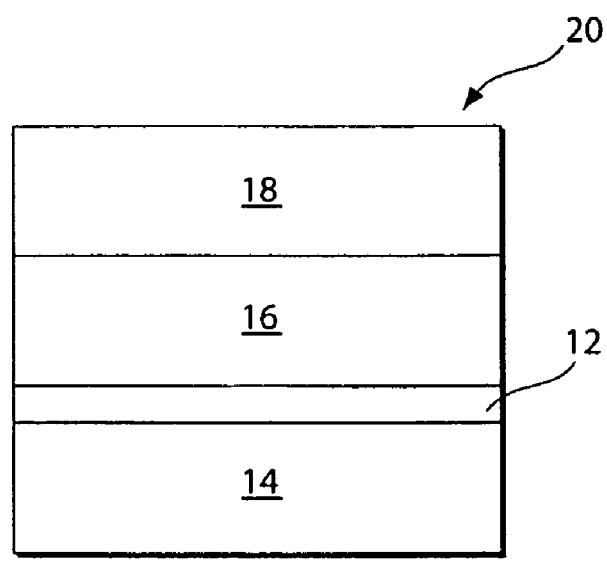
FIG. 2 illustrates a structure including III-nitride material regions having low screw dislocation densities according to another embodiment of the present invention.
Figure 3:
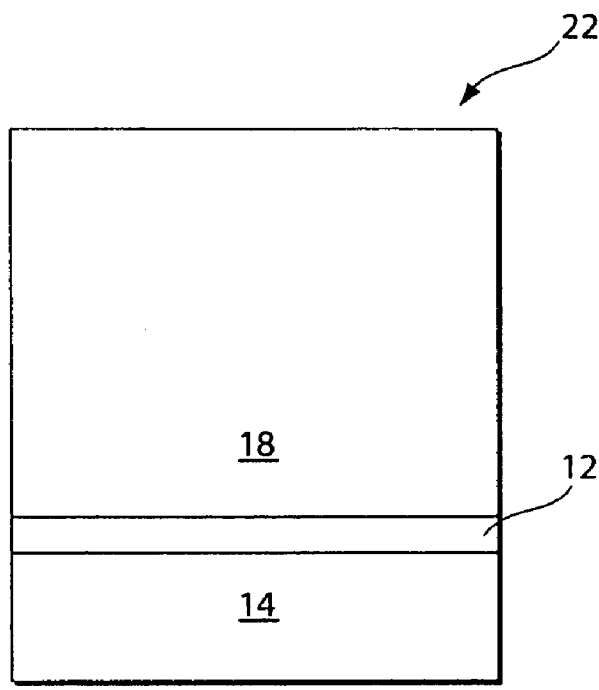
FIG. 3 illustrates a structure including III-nitride material regions having low screw dislocation densities according to another embodiment of the present invention.

Strain-absorbing layer 12 helps absorb strain that arises due to lattice differences between the crystal structure of the substrate and the crystal structure of layer/region formed on the strain-absorbing layer (e.g., intermediate layer 15 in FIG. 1; transition layer 16 in FIG. 2; and gallium nitride material region in FIG. 3). In the absence of the strain-absorbing layer, this strain is typically accommodated by the generation of misfit dislocations in the intermediate layer (or, other overlying layer) at the interface with the substrate. Thus, by providing an alternative mechanism for accommodating stress, the presence of the strain-absorbing layer may reduce the generation of misfit dislocations at the interface with the substrate. It is believed that the reduction in misfit dislocations can also lead to a reduction in screw dislocations in the overlying layers (e.g., intermediate layer 15, transition layer 16 and gallium nitride material region 18).

Furthermore, the strain-absorbing layer can help absorb strain that arises due to differences in the thermal expansion rate of the substrate as compared to the thermal expansion rate of the intermediate layer and/or the gallium nitride material region. Such differences can lead to formation of misfit dislocations at the intermediate layer/substrate interface, or cracking in either the intermediate layer and/or gallium nitride material region. As described further below, transition layer 16 also helps absorb this thermally-induced strain.

Suitable strain-absorbing layers have been described in commonly-owned, co-pending U.S. patent application Ser. No. not yet assigned, filed Jun. 28, 2004, entitled "Gallium Nitride Materials and Methods Associated with the Same" which is incorporated by reference above. In certain preferred embodiments, strain-absorbing layer 12 is formed of a silicon nitride-based material. Silicon nitride-based materials include any silicon nitride-based compound (e.g., $Si_xN_y$, such as SiN and $Si_3N_4$, SiCN, amongst others) including non-stoichiometric silicon nitride-based compounds. In some embodiments, a SiN strain-absorbing layer may be preferred. Silicon nitride material-based strain-absorbing layers may be particularly preferred when formed directly on a silicon substrate, as described further below.

It should also be understood that it is possible for the strain-absorbing layer to be formed of other types of materials according to other embodiments of the invention. Though all of the advantages associated with silicon nitride-based materials may not be achieved in these embodiments.

In some embodiments, it is preferable for the strain-absorbing layer to have an amorphous (i.e., non-crystalline) crystal structure. Amorphous strain-absorbing layers are particularly effective in accommodating strain and, thus, reducing the generation of misfit dislocations.

However, it should be understood that in certain embodiments of the invention, the strain-absorbing layer may have a single crystal or poly-crystalline structure. In these cases, however, all of the advantages associated with an amorphous strain-absorbing layer may not be realized.

In some embodiments, it is preferred for the strain-absorbing layer to be very thin, particularly when formed of amorphous and/or silicon nitride-based materials. It has been discovered that very thin strain-absorbing layers (e.g., silicon nitride-based strain-absorbing layers) may enable formation of intermediate layer(s) having an epitaxial relationship with the substrate, while also being effective in reducing the number of misfit dislocations (which may lead to the reduced screw dislocations in the III-nitride material region(s)). In certain cases (e.g., when the strain-absorbing layer is amorphous), it is desirable for the strain-absorbing layer to have a thickness that is large enough to accommodate sufficient strain associated with lattice and thermal expansion differences between the substrate and intermediate layer 15 to reduce generation of misfit dislocations. In these cases, it may also be desirable for the strain-absorbing layer to be thin enough so that the intermediate layer has an epitaxial relationship with the substrate. This can be advantageous for formation of a high quality, single crystal III-nitride material region (e.g., gallium nitride material region). If the strain-absorbing layer is too thick, then the intermediate layer is not formed with epitaxial relationship with the substrate.

In some embodiments, the strain-absorbing layer has a thickness of less than about 100 Angstroms which, in these embodiments, can allow the epitaxial relationship between the substrate and the intermediate layer. In some embodiments, it may be preferable for the strain-absorbing layer to have a thickness of less than about 50 Angstroms to allow for the epitaxial relationship.

The strain-absorbing layer may have a thickness of greater than about 10 Angstroms which, in these embodiments, is sufficient to accommodate strain (e.g., resulting from lattice and thermal expansion differences) and can facilitate forming a strain-absorbing layer that covers the entire substrate, as described further below. In other embodiments, the strain-absorbing layer may have a thickness of greater than about 20 Angstroms to sufficiently accommodate strain.

Suitable thickness ranges for the strain-absorbing layer include all of those defined by the ranges described above (e.g., greater than about 10 Angstroms and less than about 100 Angstroms, greater than about 10 Angstroms and less than about 50 Angstroms, and the like). Also, the strain-absorbing layer thickness may be between about 20 Angstroms and about 70 Angstroms.

It should be understood that suitable thicknesses of the strain-absorbing layer may depend on a number of factors including the composition and crystal structure of the strain-absorbing layer; the composition, thickness and crystal structure of the intermediate layer; as well as the composition, thickness, and crystal structure of the substrate, amongst other factors. Suitable thicknesses may be determined by measuring the effect of thickness on misfit dislocation density and other factors (e.g., the ability to deposit an intermediate layer having an epitaxial relationship with the substrate, etc.).

It is also possible for the strain-absorbing layer to have a thickness outside the above ranges.

In some cases, the thickness of the strain-absorbing layer is relatively uniform across the entire layer. For example, in these cases, the strain-absorbing layer may have a thickness uniformity variation of less than 25 percent, or less than 10 percent, across the entire strain-absorbing layer.

As described further below, in some embodiments, the strain-absorbing layer may be formed by nitridating a top surface region of a silicon substrate. That is, the surface region of the substrate may be converted from silicon to a silicon nitride-based material to form the strain-absorbing layer. It should be understood that, as used herein, such strain-absorbing layers may be referred to as being "formed on the substrate", "formed over the substrate", "formed directly on the substrate" and as "covering the substrate". Such phrases also refer to strain-absorbing layers that are formed by depositing a separate layer (e.g., using a separate nitrogen source and silicon source) on the top surface of the substrate and are not formed by converting a surface region of the substrate.

In the illustrative embodiment, the strain-absorbing layer covers substantially the entire top surface of the substrate. This arrangement may be preferable to minimize the number of misfit dislocations in the intermediate layer and, thus, the number of screw dislocations in the III-nitride material region(s). In other embodiments, the strain-absorbing layer may cover a majority of the top surface of the substrate (e.g., greater than 50 percent or greater than 75 percent of the top surface area).

Also, in the illustrative embodiment, strain-absorbing layer 12 is formed across the entire area between the substrate and the intermediate layer. That is, the strain-absorbing layer separates the substrate and the intermediate layer at all points with the strain-absorbing layer being directly on the substrate and the intermediate layer being directly on the strain-absorbing layer. This arrangement may be preferable to minimize the number of misfit dislocations in the intermediate layer. In other embodiments, the strain-absorbing layer may be formed across a majority of the area (e.g., greater than 50 percent, or greater than 75 percent) between the substrate and the intermediate layer. If the strain-absorbing layer is not present across the entire (or, at least, the majority of the) area between the substrate and the intermediate layer, the above-noted advantages associated with the strain-absorbing layer may not be realized.

The extent that the strain-absorbing layer covers the substrate (and the area between the intermediate layer and the substrate) in the present invention may be distinguished from certain prior art techniques in which a discontinuous silicon nitride layer is formed (in some cases, inadvertently) between a silicon substrate and an overlying layer.

It should be understood that, in other embodiments, the strain-absorbing layer may be positioned in other locations such as between two different layers (i.e., not formed directly on the substrate). In these embodiments, the strain-absorbing layer may reduce the formation of misfit dislocations and reduce the propagation of screw dislocations to the layer(s)/region(s) that overlie the strain-absorbing layer. The strain-absorbing layer may cover the layer on which it is formed to a similar extent as described above in connection with the strain-absorbing layer covering the substrate.

As noted above, the presence of the strain-absorbing layer advantageously results in very low misfit dislocation densities within the intermediate layer (e.g., at, or very near, an interface between the strain-absorbing layer and the intermediate layer). In some embodiments of the invention, the misfit dislocation density in the overlying layer is less than about $10^{10}/cm^2$; and, in other embodiments, less than about $10^8/cm^2$. Even lower misfit dislocation densities in the overlying layer may be achieved, for example, less than about $10^5/cm^2$. In some cases, the presence of misfit dislocations may not be readily detectable which generally means that the misfit dislocation density is less than about $10^2/cm^2$. The specific misfit dislocation density depends, in part, on the particular structure including factors such as the thickness, composition and crystal structure of the strain-absorbing layer; the composition, thickness and crystal structure of the overlying layer; as well as the composition, thickness, and crystal structure of the substrate, amongst other factors.

It may be preferred for structure 10 to include an intermediate layer 15 formed of a nitride-based material. Suitable nitride-based materials include, but are not limited to, aluminum nitride-based materials (e.g., aluminum nitride, aluminum nitride alloys) and gallium nitride materials. In some cases, the intermediate layer has a constant composition. In other cases, as described further below, the intermediate layer may be compositionally-graded. Suitable compositionally-graded layers are described further below and have been described in commonly-owned U.S. Pat. No. 6,649,287, entitled "Gallium Nitride Materials and Methods" filed on Dec. 14, 2000, which is incorporated herein by reference.

It may be preferable for the intermediate layer to have a single crystal structure. As noted above, in some embodiments, the thickness of the strain-absorbing layer is controlled so that the intermediate layer has an epitaxial relationship with the substrate. It may be advantageous for the intermediate layer to have a single crystal structure because it facilitates formation of a single crystal, high quality gallium nitride material region having low screw dislocation densities. In some embodiments, the intermediate layer has a different crystal structure than the substrate.

It should also be understood that the intermediate layer may not have a single crystal structure and may be amorphous or polycrystalline, though all of the advantages associated with the single crystal intermediate layers may not be achieved.

The intermediate layer may have any suitable thickness. For example, the intermediate layer may be between about 10 nanometers and 5 microns, though other thicknesses are also possible.

It should be understood that certain embodiments of the invention may not include an intermediate layer 15 (e.g., as shown in FIG. 2).

In the illustrative embodiment, transition layer 16 is formed directly on the intermediate layer. In certain embodiments, such as when the intermediate layer has a constant composition, it may be preferred for the transition layer to be formed of a compositionally-graded material (e.g., a compositionally-graded nitride-based material). Suitable compositionally-graded layers have been described in commonly-owned U.S. Pat. No. 6,649,287 which is incorporated by reference above.

Compositionally-graded transition layers have a composition that is varied across at least a portion of the layer. Compositionally-graded transition layers are particularly effective in reducing crack formation in gallium nitride material regions formed on the transition layer by lowering thermal stresses that result from differences in thermal expansion rates between the gallium nitride material and the substrate (e.g., silicon). Compositionally-graded transition layers may also contribute to reducing generation of screw dislocations in the III-nitride material layer(s)/region(s) (e.g., gallium nitride material region). In some cases, the compositionally-graded transition layers may also contribute to reducing mixed and edge dislocation densities.

According to one set of embodiments, the transition layer is compositionally-graded and formed of an alloy of gallium nitride such as $Al_xIn_yGa_{(1-x-y)}N$, $Al_xGa_{(1-x-y)}N$, and $In_yGa_{(1-y)}N$. In these embodiments, the concentration of at least one of the elements (e.g., Ga, Al, In) of the alloy is varied across at least a portion of the thickness of the transition layer. When transition layer 16 has an $Al_xIn_yGa_{(1-x-y)}N$ composition, x and/or y may be varied. When the transition layer has a $Al_xGa_{(1-x)}N$ composition, x may be varied. When the transition layer has a $In_yGa_{(1-y)}N$ composition, y may be varied.

In certain preferred embodiments, it is desirable for the transition layer to have a low gallium concentration at a back surface which is graded to a high gallium concentration at a front surface. It has been found that such transition layers are particularly effective in relieving internal stresses within gallium nitride material region 18. For example, the transition layer may have a composition of $Al_xGa_{(1-x)}N$, where x is decreased from the back surface to the front surface of the transition layer (e.g., x is decreased from a value of 1 at the back surface of the transition layer to a value of 0 at the front surface of the transition layer).

In some preferred embodiments, structure 10 includes an aluminum nitride intermediate layer 15 and a compositionally-graded transition layer 16. In some preferred embodiments, the compositionally-graded transition layer has a composition of $Al_xGa_{(1-x)}N$, where x is graded from a value of 1 at the back surface of the transition layer to a value of 0 at the front surface of the transition layer. The composition, for example, can be graded discontinuously (e.g., step-wise) or continuously. One discontinuous grade may include steps of AlN, $Al_{0.6}Ga_{0.4}N$ and $Al_{0.3}Ga_{0.7}N$ proceeding in a direction toward the gallium nitride material region.

It should be understood that, in other cases, transition layer 16 may have a constant composition and may not be compositionally-graded. In some cases (e.g., when the substrate is not a silicon substrate), the transition layer may have a constant composition. Suitable compositions include, but are not limited to, aluminum nitride-based materials (e.g., aluminum nitride, aluminum nitride alloys) and gallium nitride materials. In these constant composition embodiments, the transition layer may be similar to the intermediate layer in other illustrative embodiments.

Figure 5:
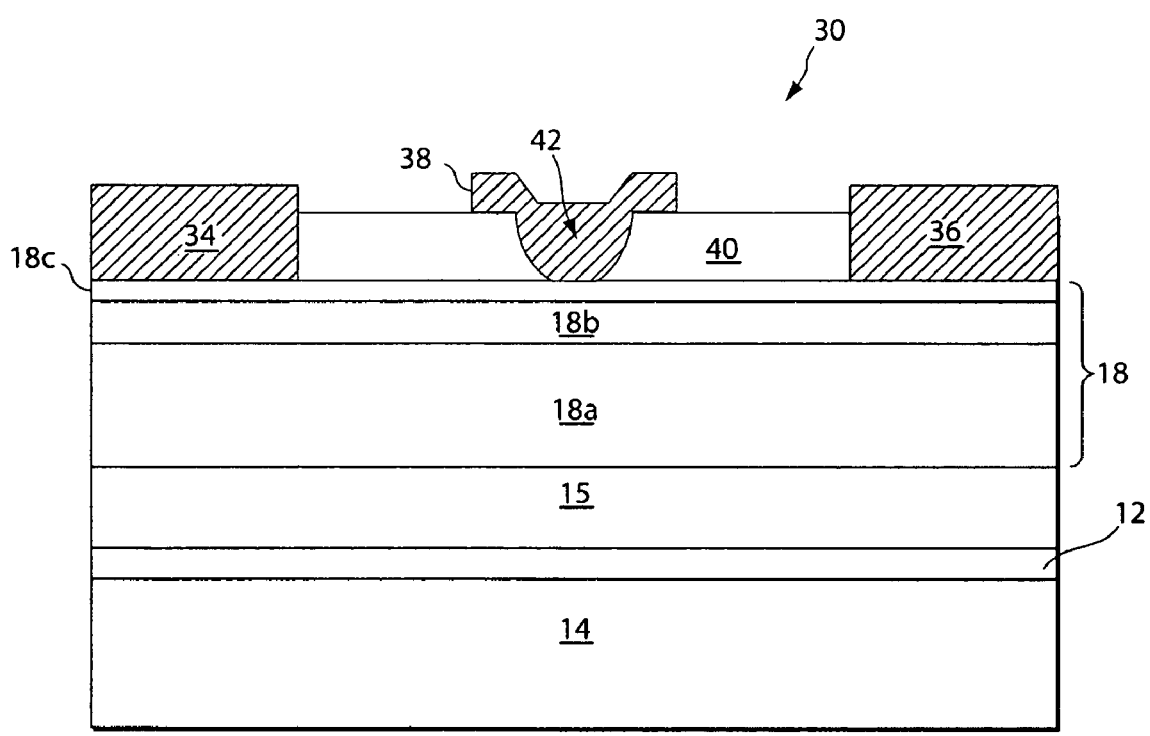
FIG. 5 illustrates a FET device including III-nitride material regions having low screw dislocation densities according to one embodiment of the invention.

The strain absorbing layer, intermediate layer and transition layer are not typically (though may be) part of the active region of devices formed from structures of the invention. As described above, these layers may be formed to facilitate deposition of gallium nitride material region 18. However, in some cases, the intermediate layer and/or transition layer may have other functions including functioning as a heat spreading layer that helps remove heat from active regions of the semiconductor structure during operation of a device. For example, such transition layers that function as heat spreading layers have been described in commonly-owned, co-pending U.S. patent application Ser. No. 09/792,409 entitled "Gallium Nitride Materials Including Thermally-Conductive Regions," filed Feb. 23, 2001, which is incorporated herein by reference. Active regions of devices formed from the structure of the invention may be formed in gallium nitride material region 18. Gallium nitride material region 18 comprises at least one gallium nitride material layer. In some cases, gallium nitride material region 18 includes only one gallium nitride material layer. In other cases, gallium nitride material region 18 includes more than one gallium nitride material layer. For example, the gallium nitride material region may include multiple layers (e.g., 18a, 18b, 18c) as shown in FIG. 5. In embodiments having more than one gallium nitride material layer, each layer may have the reduced screw dislocation densities noted above.

Suitable gallium nitride material layer arrangements have been described, for example, in commonly-owned, co-pending U.S. patent application Ser. No. 10/740,376 entitled "Gallium Nitride Material Devices Including an Electrode-Defining Layer and Methods of Forming the Same," filed Dec. 17, 2003, which is incorporated herein by reference.

Preferably, gallium nitride material region 18 also has a low crack level in addition to the low screw dislocation densities noted above. As described above, the transition layer (particularly when compositionally-graded) and/or intermediate layer may reduce crack formation. Gallium nitride materials having low crack levels have been described in U.S. Pat. No. 6,649,287 incorporated by reference above. In some cases, the gallium nitride material region has a crack level of less than 0.005 $\mu m/\mu m^2$. In some cases, the gallium nitride material region has a very low crack level of less than 0.001 $\mu m/\mu m^2$. In certain cases, it may be preferable for the gallium nitride material region to be substantially crack-free as defined by a crack level of less than 0.0001 $\mu m/\mu m^2$.

In certain cases, gallium nitride material region 18 includes a layer (or layers) which have a single crystal (i.e., monocrystalline) structure. In some cases, the gallium nitride material region includes one or more layers having a Wurtzite (hexagonal) structure.

The thickness of gallium nitride material region 18 and the number of different layers are dictated, at least in part, on the application in which the structure is used. At a minimum, the thickness of the gallium nitride material region is sufficient to permit formation of the desired structure or device. The gallium nitride material region generally has a thickness of greater than 0.1 micron, though not always. In other cases, gallium nitride material region 18 has a thickness of greater than 0.5 micron, greater than 2.0 microns, or even greater than 5.0 microns. In some cases, gallium nitride material region has a thickness of less than 10.0 microns, or less than 5.0 microns. It may be advantageous for the gallium nitride material region to have thicknesses less than these values to limit processing times and for other processing reasons.

In some embodiments, the III-nitride material layer(s)/region(s) (e.g., gallium nitride material regions) may comprise limited amounts, or be substantially free, of additives (other than dopants). For example, the gallium nitride material may include less than about 0.01 ppm of alkali metal elements, or may be substantially free of alkali metal elements. This is an advantage over certain prior art processes, which may have used alkali metals in III-nitride material production, due to the elimination of impurities.

As shown, the layers/regions of the device (e.g., strain-absorbing layer, intermediate layer, transition layer, gallium nitride material region) may be substantially planar in the final device or structure. As described further below, substantially planar layers/regions may be grown in vertical (e.g., non-lateral) growth processes. Certain lateral growth processes may lead to structures having non-planar layers/regions (e.g., as shown in U.S. Pat. No. 6,265,289). Planar layers/regions (and substrates, as noted below) can be advantageous in some embodiments, for example, in forming gallium nitride material regions having substantially constant screw dislocation densities and in simplifying processing, amongst other advantages. Though it should be understood that, in some embodiments of the invention, lateral growth processes may be used (in some cases, combined with vertical growth processes) as described further below.

The layers/regions may form a substantially planar interface with respective underlying layers/regions (including substrate). For example, the gallium nitride material region may form a substantially planar interface with transition layer 16; and, strain-absorbing layer 12 or the transition layer 16 may form a substantially planar interface with the substrate. This also may be indicative of a vertical growth process, in contrast with structures formed in lateral growth processes (e.g., as shown in U.S. Pat. No. 6,265,289). Forming a substantially planar interface between the gallium nitride material region and the underlying layer (e.g., transition layer 16) may lead to several advantages including promoting formation of substantially constant screw dislocation densities in the gallium nitride material region and simplifying processing, amongst other advantages.

It should be understood that the structures of the present invention are not limited to substantially planar layers/regions and/or interfaces. In some embodiments, the structures include non-planar layers/regions and/or interfaces.

In some embodiments, the layers/regions may form a continuous interface with respective underlying layers/regions (including substrate). That is, the layers/regions of the structure (e.g., strain-absorbing layer, intermediate layer, transition layer, gallium nitride material region) may continuously extend across respective underlying layers/regions. For example, the gallium nitride material region may form a continuous interface with transition layer 16; and, strain-absorbing layer 12 or the transition layer 16 may form a continuous interface with the substrate. The layers/regions may also continuously cover the top surface of the respective underlying layers/regions.

As described above, in certain preferred embodiments, substrate 14 is a silicon substrate. As used herein, a silicon substrate refers to any substrate that includes a silicon surface. Examples of suitable silicon substrates include substrates that are composed entirely of silicon (e.g., bulk silicon wafers), silicon-on-insulator (SOI) substrates, silicon-on-sapphire substrate (SOS), and SIMOX substrates, amongst others. Suitable silicon substrates also include substrates that have a silicon wafer bonded to another material such as diamond, AlN, or other polycrystalline materials. Silicon substrates having different crystallographic orientations may be used, though single crystal silicon substrates are preferred. In some cases, silicon (111) substrates are preferred. In other cases, silicon (100) substrates are preferred.

It should be understood that other types of substrates may also be used including sapphire, silicon carbide, indium phosphide, silicon germanium, gallium arsenide, gallium nitride, aluminum nitride and other III-V compound substrates. However, in embodiments that do not use silicon substrates, all of the advantages associated with silicon substrates may not be achieved. In some embodiments, it may be preferable to use non-nitride material-based substrates such as silicon, sapphire, silicon carbide, indium phosphide, silicon germanium and gallium arsenide.

In some cases (e.g., FIG. 4), as described further below, the substrate (and other layers) may be removed to form a free-standing III-nitride material region having low screw dislocation densities.

Substrate 14 may have any suitable dimensions. Suitable diameters may include, but are not limited to, about 2 inches (50 mm), 4 inches (100 mm), 6 inches (150 mm), and 8 inches (200 mm). Advantageously, the strain-absorbing layer may be used to form a high quality gallium nitride material region on substrates (e.g., silicon substrates) over a variety of thicknesses. In some cases, it may be preferable for the substrate to be relatively thick, such as greater than about 125 micron (e.g., between about 125 micron and about 800 micron, or between about 400 micron and 800 micron). Relatively thick substrates may be easy to obtain, process and can resist bending which can occur, in some cases, in thinner substrates. In other embodiments, thinner substrates (e.g., less than 125 microns) are used, though these embodiments may not have the advantages associated with thicker substrates, but can have other advantages including facilitating processing and/or reducing the number of processing steps. In some processes, the substrate initially is relatively thick (e.g., between about 200 microns and 800 microns) and then is thinned during a later processing step (e.g., to less than 150 microns).

In some preferred embodiments, the substrate is substantially planar in the final device or structure. Substantially planar substrates may be distinguished from substrates that are textured and/or have trenches formed therein (e.g., as in U.S. Pat. No. 6,265,289). Substantially planar substrates may facilitate formation of substantially planar layers/regions thereupon.

FIG. 2 illustrates a semiconductor structure 20 according to another embodiment of the invention. Semiconductor structure 20 is similar to that shown in FIG. 1 except the structure does not include intermediate layer 15.

FIG. 3 illustrates a semiconductor structure 22 according to another embodiment of the invention. Semiconductor structure 20 is similar to that shown in FIG. 1 except the structure does not include intermediate layer 15 or transition layer 16.

Figure 4:
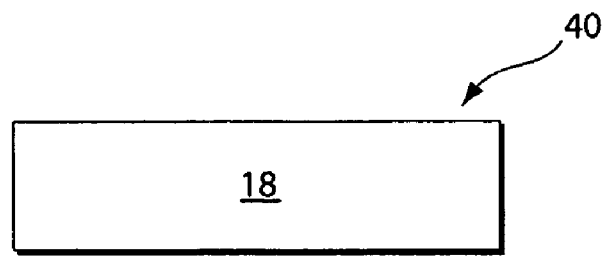
FIG. 4 illustrates a free-standing III-nitride material region having a low screw dislocation density according to another embodiment of the present invention.

FIG. 4 illustrates a structure 40 that comprises a free-standing gallium nitride material region 18. The free-standing gallium nitride material region may be formed by removing the substrate and layers (e.g., 12, 15, 16) underlying the gallium nitride material region. For example, the substrate and layers may be removed by etching processes. In this embodiment, the gallium nitride material region may have any of the characteristics described above including the low screw dislocation densities. In particular, it may be advantageous for the free-standing gallium nitride material region to have a substantially constant low screw dislocation density. Structure 40 may be further processed, for example, to form semiconductor devices.

Though FIG. 4 shows a gallium nitride material region 18, it should be understood that any of the other III-nitride materials described herein may also be converted to a free-standing structure.

The semiconductor structures illustrated in FIGS. 1-4 may form the basis of a variety of semiconductor devices. Suitable devices include, but are not limited to, transistors (e.g., FETs), as well as light-emitting devices including LEDs and laser diodes. The devices have active regions that are typically, at least in part, formed within the gallium nitride material region. Also, the devices include a variety of other functional layers and/or features (e.g., electrodes).

For example, FIG. 5 illustrates a FET device 30 according to one embodiment of the invention. Device 30 includes a source electrode 34, a drain electrode 36 and a gate electrode 38 formed on gallium nitride material region 18 (which includes a first layer 18b and a second layer 18a). The device also includes an electrode defining layer 40 which, as shown, is a passivating layer that protects and passivates the surface of the gallium nitride material region. A via 42 is formed within the electrode defining layer in which the gate electrode is, in part, formed. Strain-absorbing layer 12 is formed directly on the substrate and intermediate layer 15 is formed directly on the strain-absorbing layer. In some embodiments, the intermediate layer is compositionally-graded. In some embodiments, the intermediate layer may have a constant composition (e.g., aluminum nitride or an aluminum nitride alloy) and a compositionally-graded transition layer is formed on the strain-absorbing layer. As shown, the gallium nitride material region includes multiple gallium nitride material layers (18a, 18b, 18c) with each layer having a low screw dislocation density.

In certain embodiments, it may be preferable for the gallium nitride material of layer 18b to have an aluminum concentration that is greater than the aluminum concentration of the gallium nitride material of layer 18a. For example, the value of x in the gallium nitride material of layer 18b (with reference to any of the gallium nitride materials described above) may have a value that is between 0.05 and 1.0 greater than the value of x in the gallium nitride material of layer 18a; or, between 0.05 and 0.5 greater than the value of x in the gallium nitride material of layer 18a. For example, layer 18b may be formed of $Al_{0.26}Ga_{0.74}N$, while layer 18a is formed of GaN. This difference in aluminum concentration may lead to formation of a highly conductive region at the interface of the layers 18b, 18a (i.e., a 2-D electron gas region). In the illustrative embodiment, layer 18c may be formed of GaN.

It should be understood that other structures and devices may be within the scope of the present invention including structures and devices that are not specifically described herein. Other structures may include other layers and/or features, amongst other differences.

Semiconductor structure 10 may be manufactured using known semiconductor processing techniques. In embodiments in which the strain-absorbing layer is a silicon nitride-based material (e.g., amorphous SiN), the strain-absorbing layer may be formed by nitridating a top surface of the silicon substrate as noted above. In a nitridation process, nitrogen reacts with a top surface region of the silicon substrate to form a silicon nitride-based layer. The top surface may be nitridated by exposing the silicon substrate to a gaseous source of nitrogen at elevated temperatures. For example, ammonia may be introduced into a reaction chamber in which a silicon substrate is positioned. The temperature in the reaction chamber may be between about 1000° C. and about 1100° C. and the pressure may be between about 20 torr and about 40 torr (in some cases, about 30 torr). The reaction between nitrogen and the silicon substrate is allowed to proceed for a reaction time selected to produce a layer having a desired thickness.

It should be understood that other processes may be used to form silicon nitride-based strain-absorbing layers including processes (e.g., CVD processes) that use separate nitrogen and silicon sources. Also, when the strain-absorbing layer is formed of another type of material (non-silicon nitride-based material), other deposition processes known in the art are used.

In some embodiments, the strain-absorbing layer may be formed in-situ with the intermediate layer (and, in some cases, subsequent layers) of the structure. That is, the strain-absorbing layer may be formed during the same deposition step as the intermediate layer (and, in some cases, subsequent layers). In processes that grow a silicon nitride-based material strain-absorbing layer by introducing a nitrogen source (e.g., ammonia) into a reaction chamber as described above, a second source gas may be introduced into the chamber after a selected time delay after the nitrogen source. The second source reacts with the nitrogen source to form the intermediate layer, thus, ending growth of the strain-absorbing layer. For example, when the intermediate layer is formed of aluminum nitride, an aluminum source (e.g., trimethylaluminum) is introduced into the chamber at a selected time after the nitrogen source (e.g., ammonia). The time delay is selected so that the strain-absorbing layer grows to a desired thickness. The reaction between the second source (e.g., aluminum source) and the nitrogen source is allowed to proceed for a sufficient time to produce the intermediate layer. When the intermediate layer has a single crystal structure, the reaction conditions are selected appropriately. For example, the reaction temperature may be greater than 700° C., such as between about 1000° C. and about 1100° C. In some cases, lower growth temperatures may be used including temperatures between about 500° C. and about 600° C.

It should also be understood that the strain-absorbing layer may be formed in a separate process than the intermediate layer and subsequent layers. For example, the strain-absorbing layer may be formed on the substrate in a first process. Then, at a later time, the intermediate layers may be formed on the strain-absorbing layer in a second process.

In the processes described above, the intermediate layer is grown in a vertical growth process. That is, the intermediate layer is grown in a vertical direction (i.e., along y-axis in FIG. 1) with respect to the strain-absorbing layer. The ability to vertically grow the strain-absorbing layer having low misfit dislocation densities (which can contribute to the low screw dislocation densities) may be advantageous as compared to lateral growth processes which may be more complicated.

Transition layer 16 and gallium nitride material region 18 may also be grown in the same deposition step as the intermediate layer and the strain-absorbing layer. In such processes, suitable sources are introduced into the reaction chamber at appropriate times.

According to one preferred method, the transition layer and gallium nitride material region (and intermediate layers, if present) are grown using a metalorganic chemical vapor deposition (MOCVD) process. It should be understood that other suitable techniques known in the art may also be utilized to deposit the transition layer and the gallium nitride material region including molecular beam epitaxy (MBE), hydride vapor phase epitaxy (HVPE), and the like.

Generally, the MOCVD process involves introducing different source gases into an environment (e.g., a process system) and providing conditions which promote a reaction between the gases to form a layer. The reaction proceeds until a layer of desired thickness is achieved. The composition of the layer may be controlled, as described further below, by several factors including gas composition, gas concentration, and the reaction conditions (e.g., temperature and pressure).

Examples of suitable source gases for MOCVD growth of the transition layer and gallium nitride material region include trimethylaluminum (TMA) or triethylaluminum (TEA) as sources of aluminum; trimethylindium (TMI) or triethylindium (TEI) as sources of indium; trimethylgallium (TMG) or trimethylgallium (TEG) as sources of gallium; and ammonia ($NH_3$) as a source of nitrogen. The particular source gas used depends upon the desired composition of the layers. For example, an aluminum source (e.g., TMA or TEA), a gallium source (TMG or TEG), and a nitrogen source are used to deposit films having an $Al_xGa_{1-x}N$ composition.

The flow rates of the source gases, the ratios of the source gases, and the absolute concentrations of the source gases may be controlled to provide transition layers and gallium nitride material regions having the desired composition. For the growth of $Al_xGa_{1-x}N$ layers, typical TMA flow rates are between about 5 μmol/min and about 50 μmol/min with a flow rate of about 20 μmol/min being preferred in some cases; typical TMG flow rates are between about 5 μmol/min and 250 μmol/min, with a flow rate of 115 μmol/min being preferred in some cases; and the flow rate of ammonia is typically between about 3 slpm to about 10 slpm. The reaction temperatures are generally between about 900° C. and about 1200° C. and the process pressures are between about 1 Torr and about 760 Torr. It is to be understood that the process conditions, and in particular the flow rate, are highly dependent on the process system configuration. Typically, smaller throughput systems require less flow than larger throughput systems.

When forming a compositionally-graded transition layer, process parameters may be suitably adjusted to control the compositional grading. The composition may be graded by changing the process conditions to favor the growth of particular compositions. For example, to increase incorporation of gallium in the transition layer thereby increasing the gallium concentration, the flow rate and/or the concentration of the gallium source (e.g., TMG or TEG) may be increased. Similarly, to increase incorporation of aluminum into the transition layer thereby increasing the aluminum concentration, the flow rate and/or the concentration of the aluminum source (e.g., TMA or TEA) may be increased. The manner in which the flow rate and/or the concentration of the source is increased (or decreased) controls the manner in which the composition is graded. In other embodiments, the temperature and/or pressure is adjusted to favor the growth of a particular compound. Growth temperatures and pressures favoring the incorporation of gallium into the transition layer differ from the growth temperatures and pressures favoring the incorporation of aluminum into the transition layer. Thus, the composition may be graded by suitably adjusting temperature and pressure.

When depositing a transition layer or a gallium nitride material region (or an intermediate layer) having a constant composition, however, the process parameters are maintained constant so as to provide a layer having a constant composition. When gallium nitride material regions include more than one gallium nitride material layer having different respective compositions, the process parameters may be changed at the appropriate time to change the composition of the layer being formed.

It should be understood that all of the layers/regions on the substrate may be grown in the same process (i.e., the strain-absorbing layer, intermediate layer, transition layer and the gallium nitride material region). Or, respective layers/regions may be grown separately.

The processes described involve growing the layers/regions (i.e., the strain-absorbing layer, intermediate layer, transition layer and the gallium nitride material region) in vertical growth processes. That is, these layers/regions are grown in a vertical direction with respect to underlying layers/regions (including substrate). The ability to vertically grow the layers/regions including the gallium nitride material region having low screw dislocation densities may be advantageous as compared to lateral growth processes which may be more complicated.

However, in other embodiments of the invention (not shown), it is possible to grow, at least a portion of, gallium nitride material region 18 using a lateral epitaxial overgrowth (LEO) technique that involves growing an underlying gallium nitride layer through mask openings and then laterally over the mask to form the gallium nitride material region, for example, as described in U.S. Pat. No. 6,051,849.

In other embodiments of the invention (not shown), it is possible to grow the gallium nitride material region 18 using a pendeoepitaxial technique that involves growing sidewalls of gallium nitride material posts into trenches until growth from adjacent sidewalls coalesces to form a gallium nitride material region, for example, as described in U.S. Pat. No. 6,265,289. In these embodiments, for example, strain-absorbing layer 12 (and, in some cases, layers 15, 16) may be deposited on the sidewalls prior to lateral growth which may reduce screw dislocation densities in laterally-grown III-nitride material layers/regions (e.g., gallium nitride material regions).

Commonly-owned, co-pending U.S. patent application Ser. No. 10/740,376 entitled "Gallium Nitride Material Devices Including an Electrode-Defining Layer and Methods of Forming the Same," filed Dec. 17, 2003, which is incorporated herein by reference, further describes techniques used to grow other layers and features shown in the embodiment of FIG. 5.

It should also be understood that other processes may be used to form structures and devices of the present invention as known to those of ordinary skill in the art.

The following example is meant to be illustrative and is not limiting.

EXAMPLE 1

This example illustrates the formation of a structure including III-nitride material layers/regions having low screw dislocation densities according to one embodiment of the present invention.

A 100 mm silicon substrate was placed in a reaction chamber. Ammonia gas was introduced into the chamber as a nitrogen source. The temperature was maintained at 1030° C. and the pressure at about 30 torr. A strain-absorbing layer of amorphous silicon nitride (SiN) was formed.

About 6 seconds after the introduction of ammonia, TMA was introduced into the chamber as an aluminum source. The temperature and pressure were respectively maintained at 1030° C. and about 30 torr. Growth proceeded for about 60 minutes. An aluminum nitride (AlN) was formed.

After about 60 minutes, TMG was introduced into the chamber. Growth proceeded for about 40 minutes. An aluminum gallium nitride layer ($Al_{0.6}Ga_{0.4}N$) was formed.

After about 40 minutes, the concentration of TMG being introduced into the chamber was increased and the concentration of TMA being introduced into the chamber was decreased. Growth proceeded for 20 minutes. An aluminum gallium nitride layer ($Al_{0.3}Ga_{0.7}N$) was formed.

After about 20 minutes, the supply of TMA was turned off and only TMG was introduced into the chamber. A gallium nitride (GaN) layer was formed. Growth proceeded for 30 minutes The supply of TMA was turned back on and TMA and TMG were introduced into the chamber to grow a thin aluminum gallium nitride layer.

Figure 6:
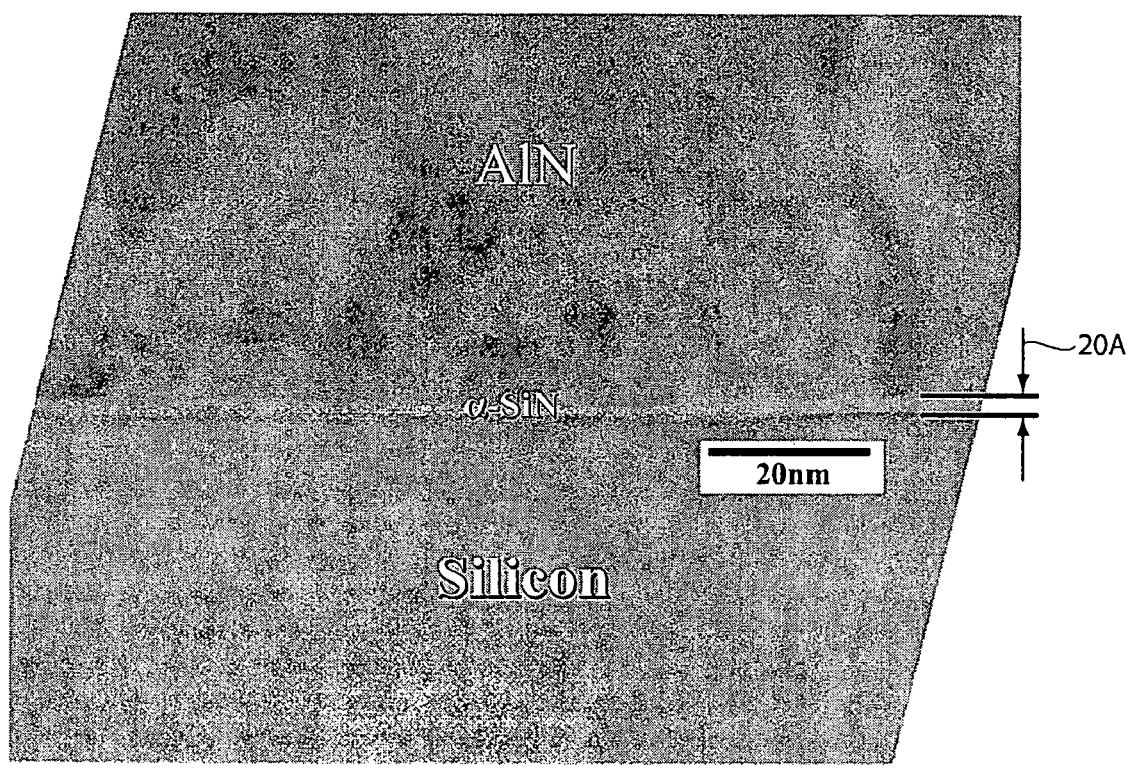
FIG. 6 is a copy of a STEM (scanning transmission electron microscope) image that illustrates the presence of a silicon nitride strain-absorbing layer between an aluminum nitride layer and a silicon substrate as described in Example 1.

FIG. 6 is a copy of a STEM (scanning transmission electron microscope) image that illustrates the presence of a silicon nitride strain-absorbing layer between the aluminum nitride layer and the silicon substrate.

A g-vector analysis was used to assess screw dislocation density of overlying III-nitride material layers/regions using conventional TEM techniques. FIGS. 7A-8B are copies of TEM images taken of vertical cross-sections of the same structure. For reference, the "*" indicates identical spatial positions on the images.

Figure 7A:
FIGS. 7A and 7B are respective copies of bright field cross-sectional TEM images of a structure as described in Example 1.
Figure 7B:

FIG. 7A is an image with the g-vector (g=(00001)) perpendicular to the substrate surface. FIG. 7B is an image with the g-vector (g=((1-100)) parallel to the substrate surface.

Figure 8A:
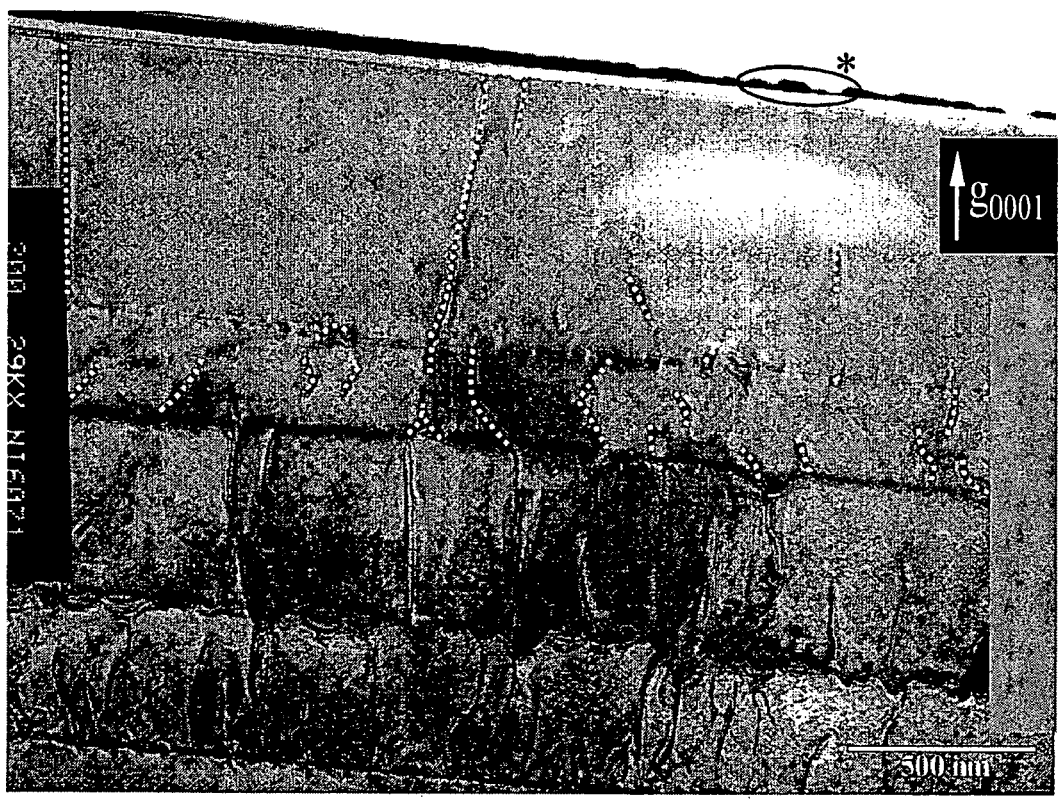
FIGS. 8A and 8B are respective copies of the TEM images of FIGS. 7A and 7B with dislocations highlighted by dashed lines as described in Example 1.
Figure 8B:
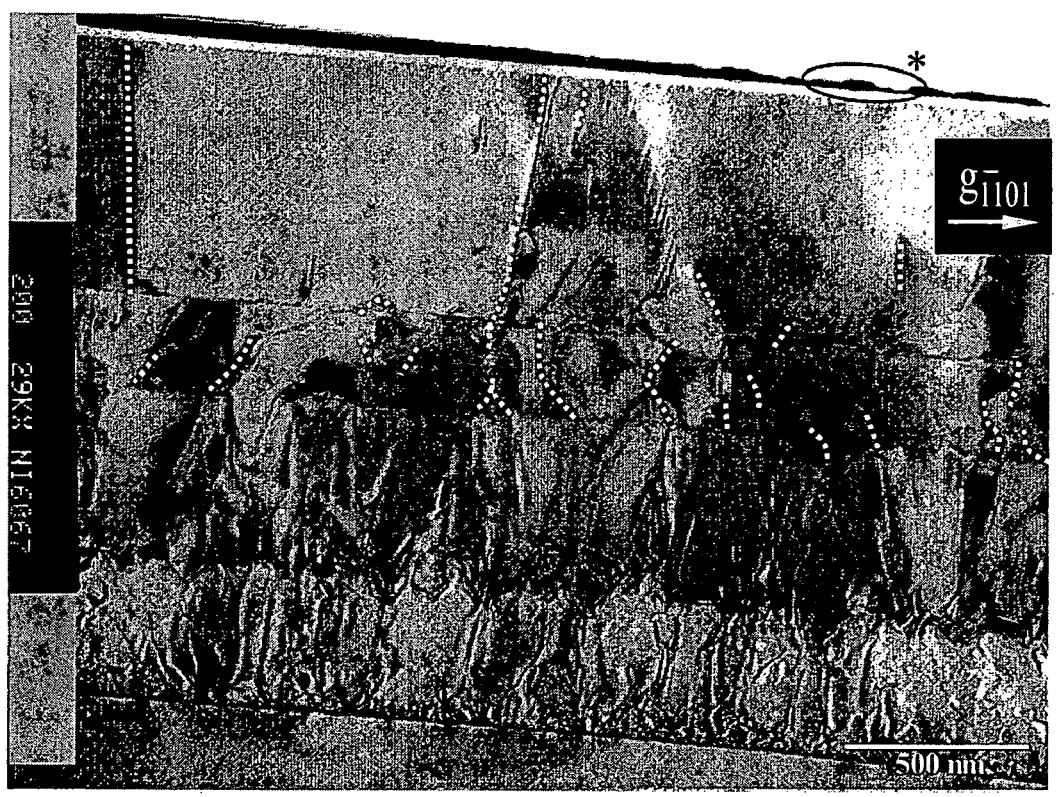

FIGS. 8A and 8B are respective copies of FIGS. 7A and 7B with dislocations present in the gallium nitride material region and a first portion of the transition layer ($Al_{0.3}Ga_{0.7}N$) highlighted by dashed lines. It should be noted that the second portion of AlGaN transition layer and the AlN layer indicate similar dislocation densities, but dashed lines were not individually noted for the sake of clarity.

As shown, all of the dislocations present in FIGS. 7A and 8A are also found in FIGS. 7B and 8B. This one-to-one correspondence indicates that all of these dislocations are edge dislocations or mixed dislocations (which include an edge component). Thus, no screw dislocations were observed in the TEM images.

Also, there are a number of dislocations present in FIGS. 7B and 8B which are not present in FIGS. 7A and 8A. This is also indicative of these dislocations being edge dislocations or mixed dislocations.

This example establishes formation of a III-nitride material layers/regions having a very low screw dislocation density. No screw dislocations were detected in the TEM images.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A semiconductor structure comprising:
   a substrate;
   a III-nitride material region formed on the substrate and having a screw dislocation density of less than $10^8/cm^2$ throughout the III-nitride material region;
   a gallium nitride material region formed on the III-nitride region material and having a screw dislocation density of less than $10^8/cm^2$ throughout the gallium nitride material region,
   wherein the gallium nitride material region has an area of greater than 1 mm×1 mm.

2. The structure of claim 1, wherein the gallium nitride material region has a constant screw dislocation density throughout the gallium nitride material region.

3. The structure of claim 1, wherein the substrate is planar.

4. The structure of claim 1, wherein the gallium nitride material region is vertically-grown.

5. The structure of claim 1, wherein the gallium nitride material region extends continuously across an underlying region.

6. The structure of claim 1, wherein the screw dislocation density is less than about $10^4/cm^2$ throughout the gallium nitride material region.

7. The structure of claim 1, wherein the screw dislocation density is zero throughout the gallium nitride material region.

8. The structure of claim 1, wherein the edge dislocation density of the gallium nitride material region is greater than about $10^8/cm^2$.

9. The structure of claim 1, wherein the substrate is silicon.

10. the structure of claim 1, further comprising a strain-absorbing layer, wherein the gallium nitride material region is formed on the strain-absorbing layer.

11. The structure of claim 10, wherein the strain-absorbing layer comprising an amorphous silicon nitride-based material layer.

12. The structure of claim 11, wherein the amorphous silicon nitride-based material layer has a thickness of less than 100 Angstroms.

13. A semiconductor structure comprising:
    a III-nitride material region including an area having dimensions of at least 100 microns×100 microns and a screw dislocation density of less than $10^4/cm^2$; and
    a strain-absorbing layer, wherein the III-nitride material region is formed on the strain-absorbing layer.

14. The structure of claim 13, further comprising a second III-nitride material region including an area having dimensions of at least 100 microns×100 microns and a screw dislocation density of less than about $10^4/cm^2$.

15. The structure of claim 13, wherein the III-nitride material region includes an area having dimensions of at least 1 cm×1 cm and a screw dislocation density of less than $10^4/cm^2$.

16. The structure of claim 13, wherein the strain-absorbing layer comprises an amorphous silicon nitride-based material layer.

17. The structure of claim 13, wherein the III-nitride material region is a gallium nitride material region.

18. The structure of claim 13, wherein the strain-absorbing layer has a thickness of less than 100 Angstroms.

19. The structure of claim 13, further comprising a substrate, wherein the strain-absorbing layer is formed on the substrate.

20. The structure of claim 19, wherein the substrate is silicon.

21. The structure of claim 19, wherein the strain-absorbing layer covers the an entire top surface of the substrate.

22. A semiconductor structure comprising:
    a III-nitride material region having a screw dislocation density of zero and an edge dislocation density of greater than $10^8/cm^2$, wherein the III-nitride material region has an area having dimensions of at least 100 micron×100 micron.

23. The structure of claim 22, further comprising a substrate, wherein the III-nitride material region is formed on the substrate.

24. The structure of claim 22, wherein the III-nitride material region is a gallium nitride material region.

25. The structure of claim 22, wherein the III-nitride material region has an area having dimensions of at least 1 mm×1 mm.

26. The structure of claim 22, further comprising a second III-nitride material region, wherein each III-nitride material region of the structure has screw dislocation density of less than $10^8/cm^2$ and an edge dislocation density of greater than $10^8/cm^2$ throughout the respective regions.

27. A semiconductor structure comprising:
    a III-nitride material region having density of edge dislocation density and a screw dislocations, the density of edge dislocations being at least $10^4$ times greater than the density of screw dislocations, wherein the III-nitride material region has an area having dimensions of at least 1 mm×1 mm.

28. The structure of claim 27, further comprising a second III-nitride material region, wherein each III-nitride material region of the structure has density of edge dislocations at least 100 times greater than a density of screw dislocations throughout the respective regions.

29. The structure of claim 27, wherein the screw dislocation density is less than $10^4/cm^2$.

30. The structure of claim 27, wherein the screw dislocation density is zero.

31. The structure of claim 27, wherein the density of edge dislocations is at least $10^6$ times greater than the density of screw dislocations.

32. The structure of claim 27, wherein the III-nitride material region has an area having dimensions of at least 1 cm×1 cm.

33. The structure of claim 27, wherein the III-nitride material region is a gallium nitride material region.

34. The structure of claim 33, wherein the gallium nitride material region is formed on a second III-nitride material region, and the second III-nitride material region is formed on a substrate.

35. The structure of claim 27, further comprising a substrate, wherein the III-nitride material region is formed on the substrate.

36. The structure of claim 35, wherein the substrate is silicon.

37. A semiconductor structure comprising:
a substrate;
a silicon nitride-based material layer having a thickness of less than 100 Angstroms and covering an entire top surface of the substrate; and
a III-nitride material region formed over the silicon nitride-based material layer and having a screw dislocation density of less than about $10^8/cm^2$.

\* \* \* \* \*